United States Patent [19]

Saarem et al.

[11] 4,012,673
[45] Mar. 15, 1977

[54] TIMING VALVE CONTROL SYSTEM

[75] Inventors: Myrl J. Saarem; Dale C. Firebaugh, both of Carson City, Nev.

[73] Assignee: Richdel, Inc., Carson City, Nev.

[22] Filed: Sept. 15, 1975

[21] Appl. No.: 613,078

[52] U.S. Cl. .......................... 361/196; 137/624.11; 361/168

[51] Int. Cl.[2] ..................................... H01H 47/18

[58] Field of Search ............ 317/141 S, 151, 155.5; 307/141, 141.4, 293 Y, 141.8; 239/DIG. 5; 137/624.11; 58/39.5, 21.13, 21.15, 21.15 S

[56] References Cited

UNITED STATES PATENTS

| | | | |
|---|---|---|---|
| 3,372,286 | 3/1968 | Rotunda | 307/141.4 |
| 3,377,532 | 4/1968 | Lane et al. | 317/141 S |
| 3,410,301 | 11/1968 | Merriner et al. | 137/624.11 X |
| 3,440,434 | 4/1969 | Yates et al. | 307/41 |
| 3,547,154 | 12/1970 | Benham | 137/624.11 |
| 3,578,245 | 5/1971 | Brock | 239/66 |
| 3,707,875 | 1/1973 | Freeman | 317/141 R X |
| 3,721,908 | 3/1973 | Jurjans | 317/141 S X |

Primary Examiner—Harry Moose
Attorney, Agent, or Firm—Keith D. Beecher

[57] ABSTRACT

A solid state timing valve control system and unit is provided which may be battery operated, and which has particular although not exclusive utility for controlling a water lawn sprinkler system. The control unit of the invention may be coupled to a water control valve in the sprinkler system, and it acts automatically to turn the valve on at the start of each of a succession of preset watering cycles, and to turn the valve off after a preset watering time at the completion of each such cycle. The control unit includes a latching-type solenoid for controlling the water control valve. The unit also includes a solid state miniaturized electronic system for introducing a turn-on pulse to the solenoid at the start of each preset watering cycle, and for introducing a turn-off pulse to the solenoid at the completion of each cycle.

12 Claims, 5 Drawing Figures

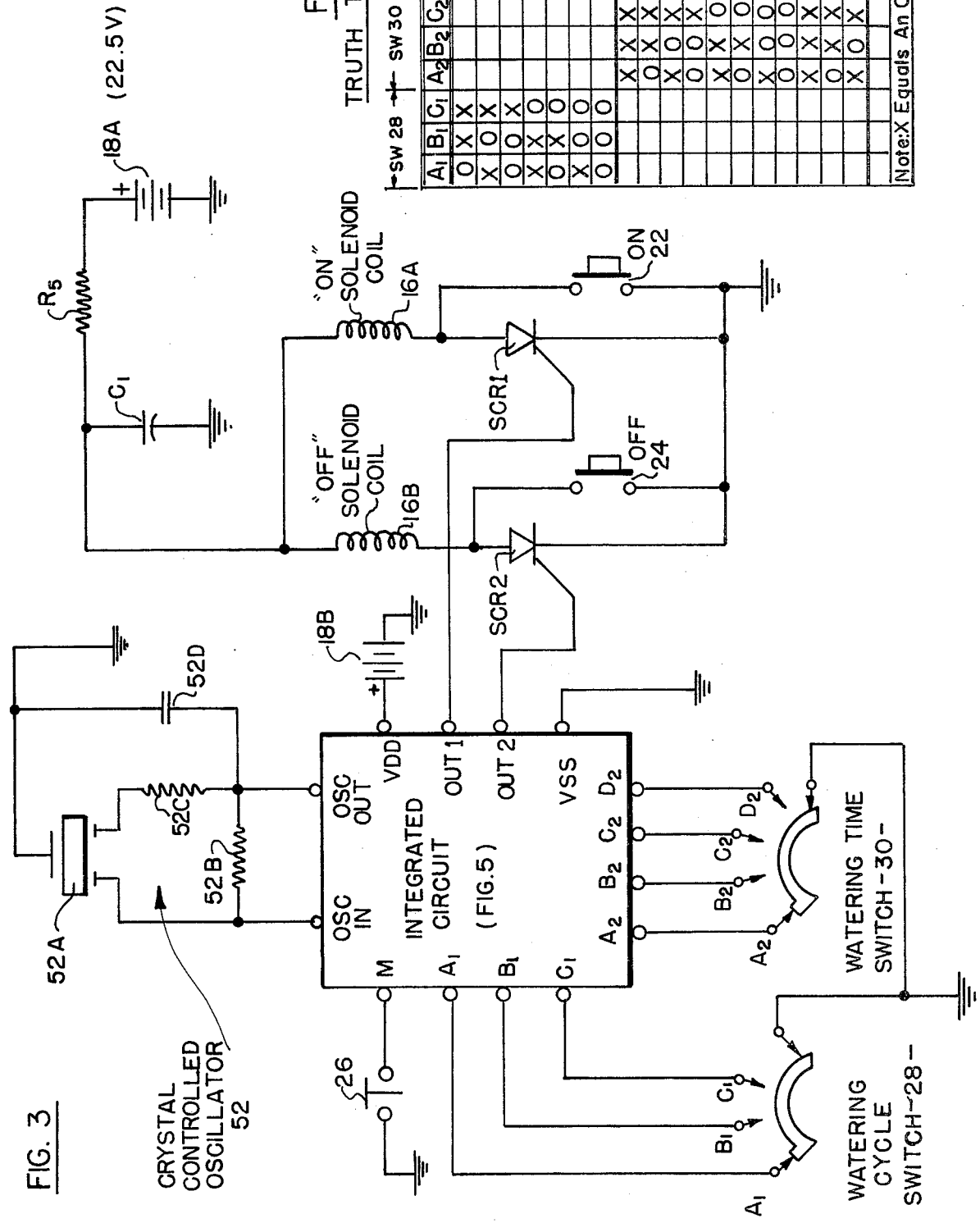

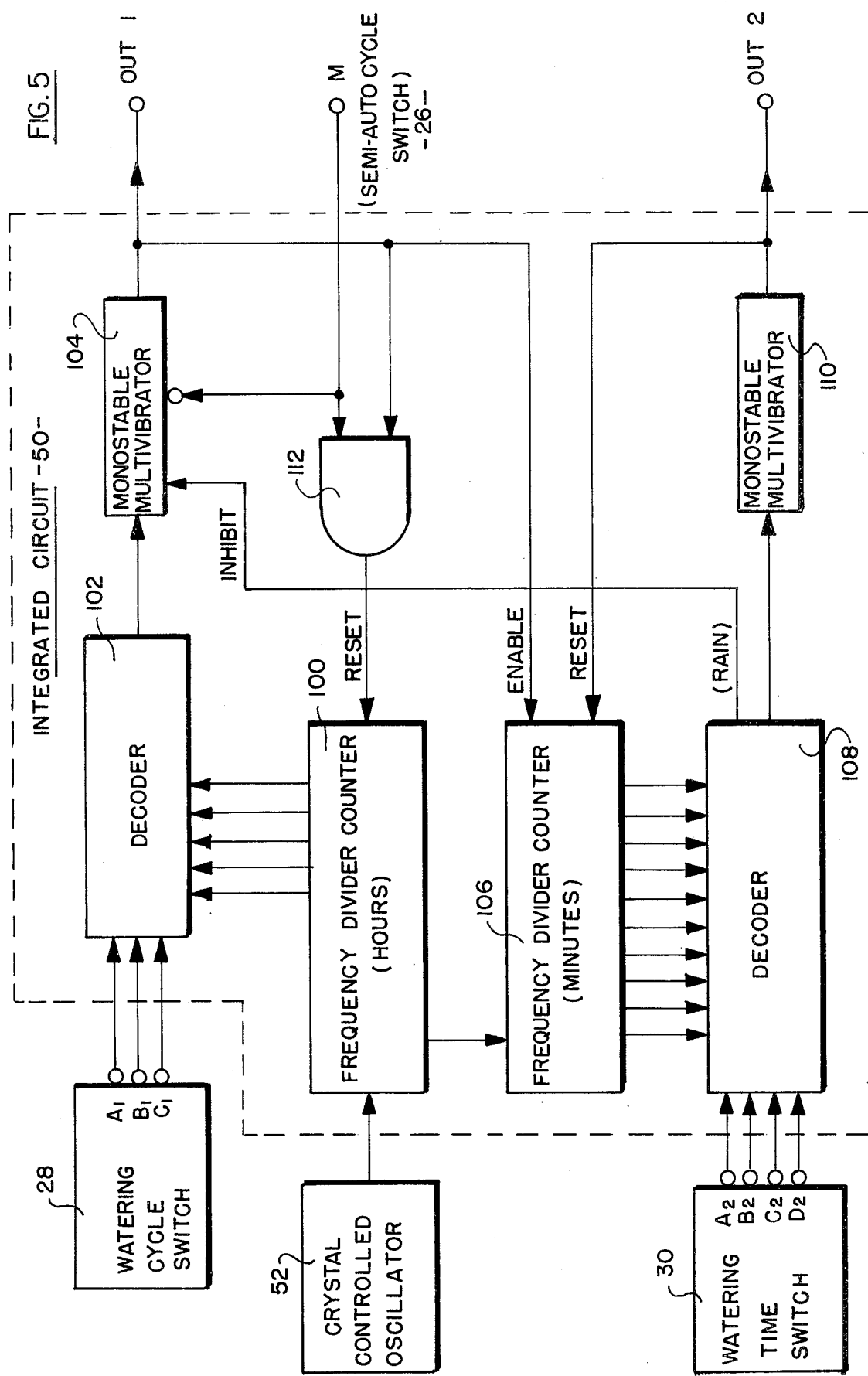

TIMING VALVE CONTROL SYSTEM

BACKGROUND OF THE INVENTION

Electrically operated control units are known which may be installed into a lawn sprinkler system, and which may be set so that different groups of sprinklers in the system may be turned on at selected times and turned off after preset watering intervals. The control system and unit of the present invention finds particular utility in lawn sprinkler systems, although its use, as mentioned above, is not limited to such systems.

In the embodiment to be described, the control unit of the invention is a self-contained battery operated system, which is intended to be mounted directly over each manually controlled water valve in the usual lawn sprinkler system, or the like, after the manually operated controller for the valve has been removed. The unit includes an electrically controlled controller for the valve, and a latching solenoid for operating the controller. The unit also includes various manually-adjustable controls, which may be set to cause the unit to turn on the lawn sprinkler system, for example, at a pre-set time each day, and then to turn off the lawn sprinkler after a pre-set watering interval.

The latching solenoid included in the control unit of the invention may be of the type described, for example, in copending application Ser. No. 471,219, which was filed May 20, 1974 in the name of Myrl J. Saarem, and which is assigned to the present assignee. When such a latching solenoid is used, the control unit introduces a turn-on pulse to the solenoid at the pre-set time at which the watering intervals are to begin, and it introduces a turn-off pulse to the solenoid at a pre-set time after the initiation of each watering interval.

The unit of the invention may be simple, compact and inexpensive in its construction, by the inclusion of an electronic integrated circuit chip for establishing the pre-settable timing operations of the unit. The integrated crcuit includes, for example, a counter and simplified logic circuitry, and it serves to count down the output of a crystal controlled oscillator to derive turn-on and turn-off pulses for the latching solenoid from the counter, which pulses may be selected by appropriately manually settable controls for different turn-on and turn-off times.

BRIEF DESCRIPTION OF THE DRAWINGS

FIG. 3 is a circuit diagram of electronic circuitry which may be included in the unit of FIGS. 1 and 2, and which includes an integrated circuit chip;

FIG. 4 is a truth table with reference to the settings of various manual controls in the unit; and FIG. 5 is a logic diagram of the internal components incorporated into the integrated circuit of FIG. 3.

DETAILED DESCRIPTION OF THE ILLUSTRATED EMBODIMENT

Figure 1:
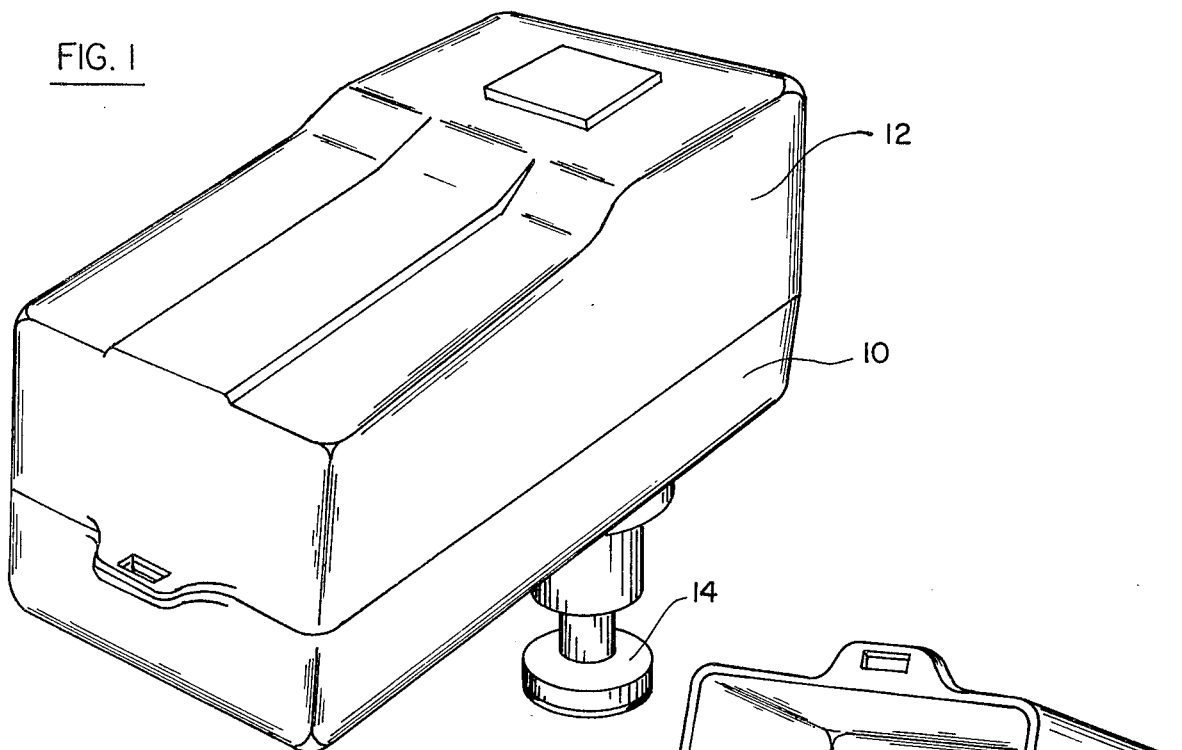
FIG. 1 is a perspective representation of a control unit which may incorporate the concepts of the invention.
Figure 2:
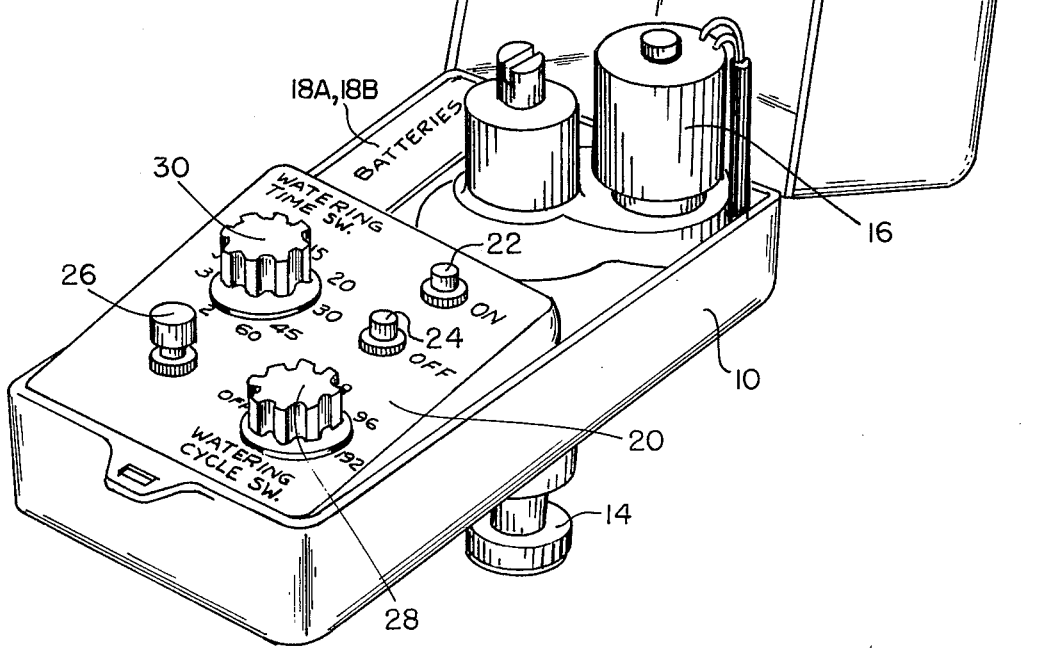
FIG. 2 is a perspective representation of the unit of FIG. 1, with the unit in an opened condition to reveal the internal operating controls and components.

It should be noted at the outset that the physical appearance of the unit of the invention is subject to wide variations, and the representation of FIGS. 1 and 2 is by way of example only. The system of the invention finds utility in any environment in which an instrumentality is to be actuated from a first state to a second state at pre-settable spaced time intervals, and in which the instrumentality is to be returned to its first state at pre-set smaller time intervals following its actuation to its second state.

The embodiment of FIGS. 1 and 2 includes a casing 10 having a generally rectangular shape, and a rectangular cover 12 which is hinged to one end of the casing 10. The illustrated unit includes a valve controller 14. The illustrated unit is intended to replace the manual controller of a typical water valve, and the unit is mounted on the water valve, by removing the manual controller, and threading the unit in place into the valve, so that the controller 14 replaces the manual controller in controlling the flow of water through the valve.

The controller 14 is controlled, for example, by a latching solenoid 16 which may be of the type described and claimed in the copending application Ser. No. 471,219, referred to above. The latching solenoid 16, for example, includes a first actuating coil 16A (FIG. 3) which, when pulsed, operates the solenoid to move the controller 14 to an "on" position. The solenoid also includes a second actuating coil 16B (FIG. 3), which when pulsed moves the controller 14 to a closed position. In each instance, the controller 14 remains in the open or closed position until one or the other of the solenoid coils 16A, 16B is pulsed.

The control unit of FIGS. 1 and 2 is self-contained, and it includes its own batteries 18A, 18B. The battery 18A may be a 22.5-volt battery, and the battery 18B may be a 3.0-volt battery. A control panel 20 is provided in the unit. A manually operated over-ride pushbutton "on" switch 22, and a manually operated over-ride pushbutton "off" switch 24 are mounted on the control panel. Manual operation of the "on" switch 22 at any time causes the solenoid 16 to turn the water valve on, and manual operation of the "off" switch 24 at any time causes the solenoid 16 to turn the water valve off.

A "semi-automatic" normally-open pushbutton switch 26 is also mounted on the control panel 20. The switch 26 may be operated to initiate a watering cycle at any time. A pair of manually settable rotary switches 28 and 30 are also mounted on the control panel. These switches may be of the binary coded decimal type, and may be turned to various settings. For example, the switch 28 controls the starting time of each watering cycle, when the unit is included in a lawn sprinkling system. The switch 28 may be turned, for example, from an "off" position in which the system is reset, to other positions selectively to provide start times at 12, 24, 48, 96, and 168 or 192 hour intervals, as shown in the "Truth Table" of FIG. 4. The switch 30 controls the watering time for each interval established by the watering cycle switch 28, and switch 30, for example, may be set to various positions, selectively to provide watering times of 2, 3, 5, 7 10, 15, 20, 30, 45 or 60 minutes, as shown in the "Truth Table" of FIG. 4.

As shown in FIG. 3, the watering cycle switch 28 is connected to input terminals A1, B1 and C1 of an integrated circuit chip 50 which is included in the electronic circuitry of the system, and which is shown in greater logic detail in FIG. 5. The switch 30, on the other hand, is connected to input terminals A2, B2, C2 and D2 of the integrated circuit chip 50. The semi-automatic switch 26 is connected to input terminal M of the chip. As described above, the switch 28 controls the starting times of each watering cycle, and the switch 30 controls the watering times, the operation of the two switches being represented, for example, by the Truth Table of FIG. 4.

A resistance-capacity crystal controlled pulse-generator oscillator 52 is connected to terminals OSC-IN and OSC-OUT of the integrated circuit chip 50. The oscillator provides a time base for the system. It includes, for example, a crystal 52A which may be established at a frequency of 32.768 KHz, and which is connected as shown. A 22 megohm resistor 52B is connected across the terminals, and a 100 kilo-ohm resistor 52C interposed between the crystal and the terminal OSC-OUT. A 10 picofarad capacitor 52D is connected to ground, and to the junction of the resistors 52B and 52C.

The oscillator circuit 52 is energized by circuitry in the chip 50 which, in turn, is connected to the positive terminal of the battery 18B by way of a terminal $V_{DD}$ of the chip. The negative terminal of the battery 18B is grounded. The battery may, for example, be formed of two 1.5-volt penlight cells. The circuitry in the integrated circuit 50 is also grounded by way of an output terminal $V_{ss}$.

As shown in FIG. 5, the output of the crystal controlled oscillator 52 is applied to a frequency divider counter 100 which is included in the integrated circuit chip 50. The counter 100 produces a first group of pulses in response to the oscillator output which occur, for example, 12, 24, 48, 96 and 192 hours respectively, after the counter has been reset. These pulses are applied to a decoder 102 which, in turn, applies triggering pulses to a monostable multivibrator 104. The "watering cycle" pulses are produced by the multivibrator and appear at the output terminal OUT-1 of the chip. When the watering cycle switch is in the "off" position the input from oscillator 52 is inhibited and counter 100 is reset to zero.

The binary coded decimal outputs from the "watering cycle" switch 28 are applied to the decoder 102 in the integrated circuit chip 50, and the decoder provides a different output for each setting of the switch 28, and these outputs are applied to the multivibrator 104.

Then, as shown by the Truth Table of FIG. 4, for example, when the watering cycle switch 28 is moed from "off" and set to the "0" position, a pulse appears at the output terminal OUT-1 12 hours after each re-setting of the counter 100; when the switch is set to the "1" position, a pulse appears at the output terminal 24 hours after each re-setting of the counter, and so on.

The counter 100 also supplies pulses to a second frequency divider 106, which develops a second group of pulses. The second group of pulses may appear, for example, 2, 3, 5, 7, 10, 15, 20, 30, 45 and 60 minutes after each re-setting of the counter 106. The counter 106 is held inhibited until it receives an enable pulse from output OUT-1. The binary coded outputs from the "watering time" switch 30 are applied to a decoder 108, which receives the second group of pulses from counter 106, and which provides a different output for each setting of the switch 30. A first output from decoder 108 is used to trigger a monostable multivibrator 110, and the output of the multivibrator appears at output terminal OUT-2 of the chip.

When the switch 30 is set to the "rain" setting shown in the Truth Table of FIG. 4, a second output is developed by the decoder 108 which serves to inhibit multivibrator 104. Therefore, so long as switch 30 is in the "rain" position the system cannot enter a watering cycle.

Therefore, when the "watering cycle" switch 28 is moved from its "0" position, for example, to its second position, an output pulse appears at the output terminal OUT-1 every 24 hours to initiate a watering cycle; since each time an output pulse appears at the output terminal OUT-1, the pulse also is applied to the counter 100 through an "and" gate 112 to reset the counter 100. The output pulse from the multivibrator 104 is also applied to counter 106 to enable the counter. Now, assuming that the "watering time" switch 30 has been set to its fourth position, for example, then, after an interval of 10 minutes following the initiation of each watering cycle, a pulse is passed to the output terminal OUT-2, and this latter pulse is also used to reset counter 106. When the semi-automatic switch 26 is operated, the multivibrator 104 is triggered to initiate a watering cycle, and counter 106 is enabled so that the time duration of the watering cycle will depend on the setting of switch 30.

As shown in FIG. 3, the output terminal OUT-1 of the integrated circuit 50 is connected to the gate electrode of a silicon controlled rectifier SCR1. The cathode of the silicon controlled rectifier is grounded, and the anode is connected to the first solenoid coil 16A.

The output terminal OUT-2 of chip 50, on the other hand, is connected to the gate electrode of a silicon controlled rectifier SCR2. The cathode of the silicon controlled rectifier SCR2 is grounded, and the anode is connected to the solenoid coil 16B. The "on" pushbutton switch 22 is shunted across the anode and cathode of the silicon controlled rectifier SCR1, and the "off" pushbutton switch 24 is shunted across the anode and cathode of the silicon controlled rectifier SCR2.

The solenoid coil 16A may have an inductance, for example, of 0.018 henries and a resistance of 3.5 ohms. The solenoid coil 16B may have an inductance of 0.007 henries, and a resistance of 2 ohms. The coils 16A and 16B are connected to a grounded 500 microfarad capacitor C1, and to a 4.7 kilo-ohm resistor R5 which, in turn, is connected to the positive terminal of the battery 18A. The negative terminal of battery 18A is grounded.

Whenever a pulse appears at the output terminal OUT-1 of the integrated circuit 50 corresponding to the setting of the watering cycle switch 28, the silicon controlled rectifier SCR1 is fired for the duration of the pulse, so that a pulse of current flows through the first solenoid coil 16A causing the solenoid 16 to move the valve controller 14 to the "on" position. The current through the first solenoid coil continues only for the duration of the pulse. However, the solenoid 16 remains latched in the "on" position until a subsequent pulse is passed through the solenoid coil 16B. This subsequent pulse occurs when an output pulse appears at the output terminal OUT-2 of the chip, corresponding to the setting of the watering time switch 30, and which momentarily fires the silicon controlled rectifier SCR2. The current flow through the solenoid coil 16B continues only for the duration of the pulse at the output terminal $F_2$. However, the solenoid 16 is set to its "off" position, and remains latched in that position until the next pulse is passed through its coil 16A.

In the circuit of FIG. 3 the silicon controlled rectifiers SCR1 and SCR2 are unlatched at the end of each firing cycle by causing the current through the individual silicon controlled rectifiers to swing negative at the completion of the firing cycle. This is achieved by the proper selection of the parameters of the circuit formed by the solenoid coils 16A, 16B; the capacitor C1 and resistor R5. With the values stated above, the resistance and inductance of the circuit will act with the capacitance to set up ringing currents in the solenoid coils. These ringing currents peak in the positive direction to actuate the corresponding solenoid and then swing in the negative direction to unlatch the corresponding silicon controlled rectifier.

The resistor R5 limits the current which can be drawn from battery 18A, and its value and the value of capacitor C1 determine the charging time for the capacitor. With the given circuit parameters, battery drain is limited to 4.5 milliamps which decreases exponentially as the capacitor C1 charges. The capacitor reaches 95% of its full charge in 45 seconds. Thus the battery drain is minimal for each operation of the solenoid coils, and yet high solenoid current is achieved. For example, 3.5 amperes peak drive for the solenoids may be achieved while only draining 4.5 milliamperes from the battery.

For a normal cycle the watering time switch 30 is set to the selected minutes and the watering cycle switch 28 is moved from "off" to the selected hour cycle position. The hours counter 100 starts timing and at the appropriate hour the decoder 102 produces a pulse which triggers the monostable multivibrator 104 producing a 10 millisecond pulse, at output terminal OUT-1, turning on the water control valve. This pulse also appears at one of the inputs of the reset "and" gate 112. This high pulse along with the high signal from the M input of the open switch 26 produces a high output from the "and" gate resetting the hours counter 100 for the next cycle. This same high pulse from output OUT-1, enables the minutes counter 106 starting its timing. When the selected watering time is reached the minutes decoder 108 produces a pulse which triggers the monostable multivibrator 110 producing a 10 millisecond pulse, at output terminal OUT-2, turning off the valve. This latter pulse also resets the minutes counter 106 to await another enable pulse from output OUT-1. The rain position of switch 30 provides a signal to the inhibit input of the hours monostable multivibrator 104 preventing a turn on pulse from reaching output OUT-1.

Closing the semi-automatic switch 26 places a low signal to input M which in turn inhibits the "and" gate 112 and triggers the hours monostable multivibrator 104 producing an output pulse on output OUT-1 turning on the water control valve. The "and" gate 112 will not reset the hours counter 100. This pulse from output OUT-1 also enables the minutes counter 100 which starts timing. At the selected time output OUT-2 is pulsed turning off the water control valve.

The invention provides, therefore, a simple and inexpensive unit which may, for example, be mounted directly on a water control valve, and which may be self-contained. The unit of the invention contains appropriate controls, so that the water valve may be set to turn on a sprinkler system at predetermined intervals, and so that the sprinkler system will remain on for a presettable watering time for each interval.

As mentioned above, the control system of the invention is not limited in its application to lawn sprinkling systems, but has general application.

Therefore, while a particular embodiment of the invention has been shown and described, modifications may be made. It is intended in the claims to cover the modifications which come within the true spirit and scope of the invention.

What is claimed is:
1. A control system including: electronic circuitry including first output terminal means and second output terminal means; first manually settable switching means connected to said electronic circuitry for causing said circuitry to produce a first output pulse at said first output terminal means at spaced time intervals as established by the setting of said first manually settable switching means; second manually settable switching means connected to said elctronic circuitry for causing said circuitry to produce a second output pulse at said second output terminal means a predetermined time after each of the first output pulses as established by the setting of said second manually settable switching means; said electronic circuitry including a first frequency divider counter, means including first decoder circuit means coupled to the first frequency divider counter and to the first manually settable switching means for providing said first output pulses at said first output terminal means and for applying a reset pulse to said first frequency divider counter; a second frequency divider counter; enabling circuit means connecting said first output terminal means to said second frequency divider counter to enable said second frequency divider counter when said first output pulse is produced at said first output terminal means; means including second decoder circuit means coupled to said second frequency divider counter and to said second manually settable switching means for producing said second output pulse at said second output terminal means and for applying a reset pulse to said second frequency divider counter; and an oscillator coupled to the first and second frequency divider counters for establishing a time base for the output pulses produced at the first and second output terminal means.

2. The control system defined in claim 1, in which said electronic circuitry is in the form of an integrated circuit.

3. The control system defined in claim 1, and which includes switching circuitry connected to the first and second output terminal means to be successively actuated by the pulses appearing thereat.

4. The control system defined in claim 1, and which includes a first switching circuit connected to said first output terminal means to be actuated from a first state to a second state by each pulse appearing at the first output terminal means; and a second switching circuit connected to said second output terminal means to be actuated from a first state to a second state by each pulse appearing at said second output terminal means.

5. The control system defined in claim 4, and which includes a latching solenoid having a first actuating coil connected to said first switching circuit for setting the solenoid to a first position when the first switching circuit is actuated to its second state, and having a second actuating coil connected to said second switching circuit for setting the solenoid to a second position when the second switching circuit is operated to its second state.

6. The control system defined in claim 5, in which said first switching circuit includes a first silicon controlled rectifier to be fired by each pulse appearing at the first output terminal means, and said second switching circuit includes a second silicon controlled rectifier to be fired by each pulse appearing at the second output terminal means.

7. The control system defined in claim 6, and which includes a battery for producing direct current operating current to the first and second actuating coils of the solenoid; and circuitry connecting the battery to the actuating coils.

8. The control system defined in claim 7, in which said circuitry includes capacitive means reacting with the actuating coils to establish ringing currents in the actuating coils to unlatch the silicon controlled rectifiers after each firing thereof by the pulses from the first and second terminal means.

9. The control system defined in claim 7, in which said circuitry includes a resistance-capacitance circuit for peaking the current flow through the actuating coils and concomitantly limiting the current drain on the battery.

10. The control system defined in claim 1, and which includes monostable multivibrator means interposed between said first decoder circuit means and said first output terminal means.

11. The control system defined in claim 10, and which includes a manually operable switch coupled to said monostable multivibrator means and to said first frequency divider counter to trigger said monostable multivibrator means and to reset said counter when the last-named switch is operated.

12. The control system defined in claim 10, and which includes inhibit circuit means connecting said second decoder circuit means to said monostable multivibrator means to inhibit said monostable multivibrator means for a particular setting of said second manually settable switching means.

* * * * *